(12) United States Patent
Kunkel

(10) Patent No.: US 7,821,182 B2
(45) Date of Patent: Oct. 26, 2010

(54) DEVICE FOR ACTUATING A SANITARY APPLIANCE

(75) Inventor: Horst Kunkel, Stuttgart (DE)

(73) Assignee: Hansa Metallwerke AG, Stuttgart (DE)

( * ) Notice: Subject to any disclaimer, the term of this patent is extended or adjusted under 35 U.S.C. 154(b) by 249 days.

(21) Appl. No.: 11/884,726

(22) PCT Filed: Feb. 11, 2006

(86) PCT No.: PCT/EP2006/001271

§ 371 (c)(1),
(2), (4) Date: Jun. 16, 2008

(87) PCT Pub. No.: WO2006/087154

PCT Pub. Date: Aug. 24, 2006

(65) Prior Publication Data

US 2008/0265713 A1    Oct. 30, 2008

(30) Foreign Application Priority Data

Feb. 21, 2005   (DE) .................... 10 2005 007 887

(51) Int. Cl.
*H01L 41/08* (2006.01)

(52) U.S. Cl. .................... 310/338; 310/328; 310/330; 310/339

(58) Field of Classification Search ............... 310/338, 310/339, 344, 348
See application file for complete search history.

(56) References Cited

U.S. PATENT DOCUMENTS

| | | | | |
|---|---|---|---|---|
| 3,167,687 A | * | 1/1965 | Buitkus | 431/132 |
| 3,339,104 A | * | 8/1967 | Kushner et al. | 315/55 |
| 4,339,011 A | | 7/1982 | DiMarzio | |
| 4,857,887 A | * | 8/1989 | Iten | 341/34 |
| 5,349,263 A | * | 9/1994 | Katayama et al. | 310/338 |
| 5,636,729 A | * | 6/1997 | Wiciel | 200/181 |
| 5,883,459 A | * | 3/1999 | Cline et al. | 310/339 |
| 6,003,390 A | | 12/1999 | Cousy | |

FOREIGN PATENT DOCUMENTS

GB    2 263 812 A    8/1993

* cited by examiner

*Primary Examiner*—Mark Budd
(74) *Attorney, Agent, or Firm*—Factor & Lake, Ltd.

(57) ABSTRACT

The invention relates to a device for actuating a sanitary appliances which comprises at least one sensor arranged in a housing and provided with a pressure-sensitive element and is actuatable by applying a force on the sensor sensitive area for deforming said element. The inventive device also comprises a control system which determines the deformation of the element and produces a signal by which the operation of the sanitary appliances is controllable. Coupling means extending perpendicularly to the operating direction of the sensor outside of the sensitive area thereof enable a force which is generated at a distance from said sensitive area to be transferable thereon.

16 Claims, 2 Drawing Sheets

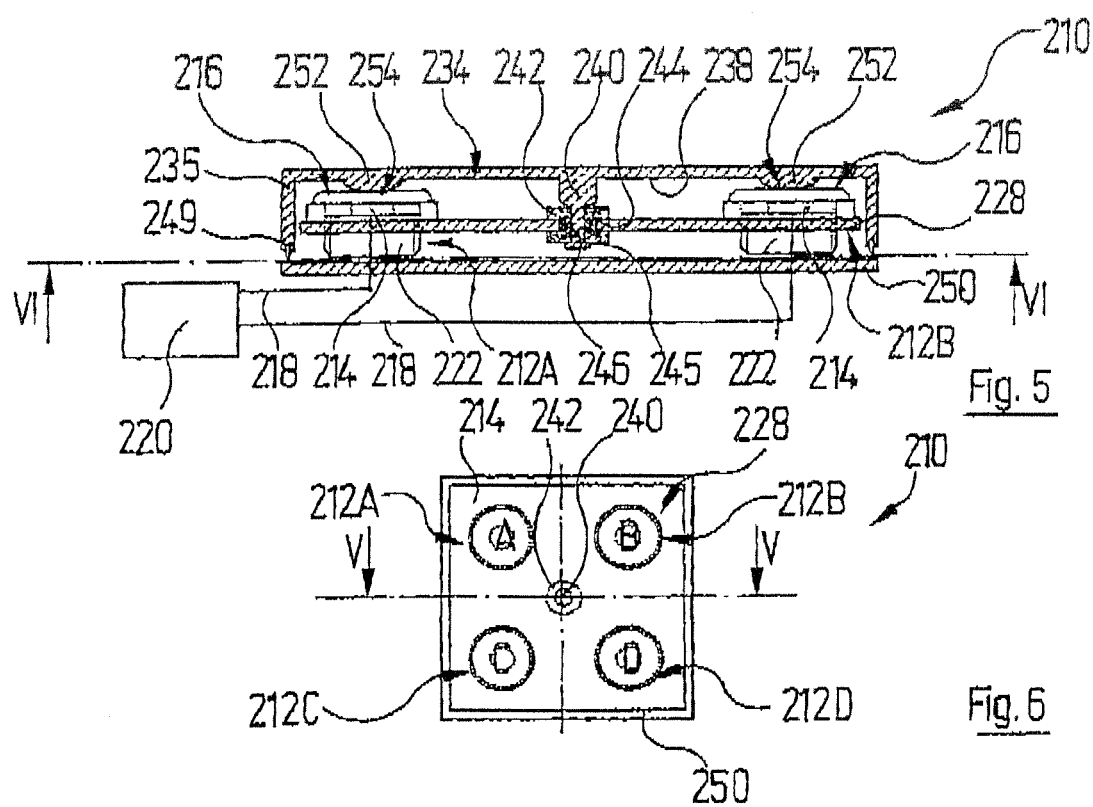

DEVICE FOR ACTUATING A SANITARY APPLIANCE

RELATED APPLICATIONS

This application claims the filing benefit of International Patent Application No. PCT/EP2006/001271, filed Feb. 11, 2006, which claims the filing benefit of German Patent Application No. 10 2005 007 887.7 filed Feb. 21, 2005, the contents of which are incorporated herein by reference.

TECHNICAL FIELD

The present invention relates to a device for actuating a sanitary appliance. More specifically, the device includes:
 a housing;
 at least one sensor arranged in the housing and provided with a pressure-sensitive element, wherein, for the purpose of actuating the sanitary appliance, a force that causes the element to be deformed can be applied to a sensitive region of the sensor; and,
 a control system, which measures the deformation of the element and thereupon generates a signal by which a function of the sanitary appliance is controllable.

BACKGROUND OF THE INVENTION

Actuating devices are known in the form of switches, in which frequently a piezoelectric element is used as a pressure-sensitive element of the sensor.

The sensitive region of such a sensor, i.e. the region to which a user normally has to apply finger pressure in order for the control system to initiate actuation of the sanitary appliance, is in most cases of relatively small spatial extent. It is usually provided with an elastic cover, which corresponds substantially to the size of the sensitive region of the sensor. A user of the sanitary appliance must take care to apply finger contact as precisely as possible to this sensitive region.

This is because, if the user does not contact the sensitive region of the sensor with sufficient precision, but presses on a location away from the sensitive region of the sensor, it might be the case that, since the pressure is not acting on the sensitive region of the sensor and the latter is not responding, from the user's perspective the switch was actuated but there is no corresponding operation of the sanitary appliance. Moreover, comparatively large amounts of force are required to operate such a sensor. Overall, therefore, the user of the sanitary appliance might be inconvenienced.

In addition, owing to the predetermined geometry of the sensor, such switches can be applied only to a limited extent in design appliances, since it is difficult to adapt the switch design to the design of the appliance.

The present invention is directed to resolving these and other matters.

SUMMARY OF THE INVENTION

An object of the present invention is to create a device for actuating a sanitary appliance, of the type initially mentioned, that takes account of the problems explained above.

This object may be achieved by providing a coupling means which extend, in a direction perpendicular to the direction of actuation of the sensor, beyond the sensitive region of the sensor, and which enable a force applied at a distance from the sensitive region of the sensor to be transferred to the sensitive region of the sensor.

The coupling means thus enable the sensor to respond even if the user presses next to the sensitive region of the sensor. The response range of the device is thereby enlarged, and a larger pressure surface or switching surface is available to the user. Consequently, there is no longer a need for the user to ensure precise finger control to the extent necessary in the case of the existing devices of the type initially mentioned. Moreover, the coupling means may be provided as visible components and be adapted, in their visible region, to the design of the sanitary appliance.

It is technically advantageous if the pressure-sensitive element is a piezoelectric or a piezoresistive element. As is known, a piezoelectric element under pressure load generates a voltage, whereas a piezoresistive element under pressure load changes its electrical resistance. Both parameters can be recognized by an appropriately designed control system, known per se, and can be assigned to a deformation of the pressure-sensitive element and thereby to the response of the associated sensor.

The coupling means are advantageously realized if they comprise a cover which projects, in a direction perpendicular to the direction of actuation of the sensor, beyond the sensitive region of the sensor and which cooperates with the sensitive region of the sensor by means of an elevation arranged on its inner surface that faces towards the sensor. Such a cover causes the elevation to be pressed against the sensitive region of the sensor even when the user of the sanitary appliance presses on the cover close to the sensitive region of the sensor.

In this case, a better pressure feel is obtained for the user of the sanitary appliance if the cover is at least partially elastic.

A good interaction of cover and sensor is achieved if the sensor is carried by a mount and if a carrying structure that connects the mount to the cover is provided on the inner surface of the cover. The cover is thus at least indirectly connected to the sensor, such their positions relative to each other are defined and cooperation of the two components is reliably ensured.

It may be advantageous, if appropriate, if the mount is fixed to the housing, in particular to its base.

An advantageous design of a single-gang switch consists in that the device comprises a single sensor, the supporting structure being constituted by retaining pins which surround the sensor with a substantially uniform angular spacing.

Preferably, the supporting structure is then constituted by four retaining pins. There is thus achieved a substantially uniform transfer of pressure to the sensitive region of the sensor, irrespective of the position of the cover to which a pressure force is applied.

In the case of an alternative design, the device comprises two sensors, the carrying structure being constituted by at least one substantially rectilinear retaining web which extends along a mirror plane of symmetry between the sensors that is applicable to the arrangement of the sensors. A rocker switch is thereby constituted in a simple manner.

A further alternative design is obtained if the device comprises four sensors which are attached to the retaining plate in such a manner that their positions describe the corner points of a rectangle, the carrying structure being constituted by a single retaining pin provided in the centre of the rectangle defined by the four sensors. In this way, a four-key switch having a relatively small space requirement is realized.

The positions of the sensors on the retaining plate preferably describe the corner points of a square.

It is to be understood that the aspects and objects of the present invention described above may be combinable and that other advantages and aspects of the present invention will become apparent upon reading the following description of the drawings and detailed description of the invention.

BRIEF DESCRIPTION OF THE DRAWINGS

FIG. 5 shows a section of a third exemplary embodiment of a device for actuating a sanitary appliance, said section being along the section line V-V in FIG. 6; and FIG. 6 shows, in smaller scale, a section of the exemplary embodiment according to FIG. 5, said section being along the section line VI-VI in FIG. 5.

DETAILED DESCRIPTION OF THE PRESENT INVENTION

Figure 1:
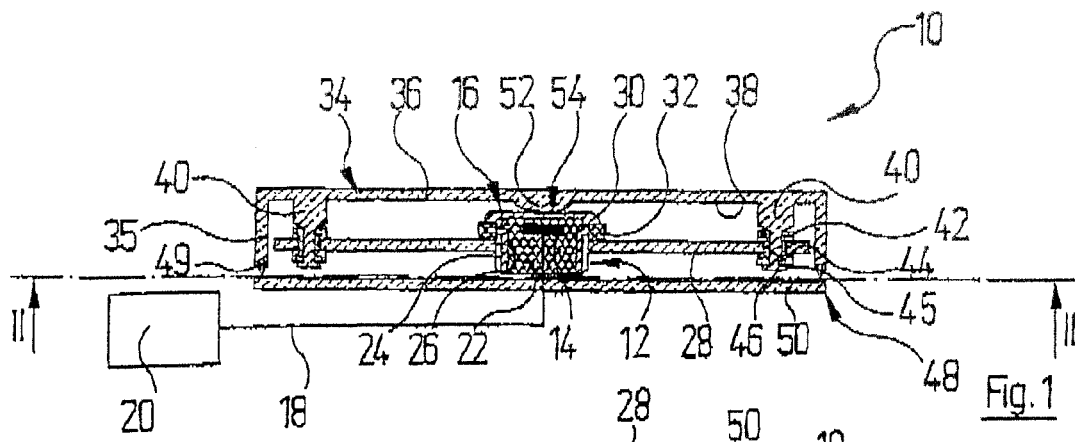
FIG. 1 shows a section of a first exemplary embodiment of a device for actuating a sanitary appliance, said section being along the section line I-I in FIG. 2.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

FIG. 1 shows a first exemplary embodiment of a device for actuating a sanitary appliance, the device being realized as a single-gang switch 10. The switch 10 comprises a sensor 12 having a pressure-sensitive element 14, which is embedded in a protective material 22 that is surrounded by a predominantly elastic sheathing 16, said protective material likewise being elastic. The pressure-sensitive element 14 is a piezoelectric element 14, such as that known per se. Alternatively, a piezoresistive element may be used.

If, in FIG. 1, pressure is applied from above onto the piezoelectric element 14 of the sensor 12, the voltage thereby generated is measured by a control system 20, via a line 18. The control system 20 thereupon operates, in known manner, a function of the sanitary appliance (not shown) that is assigned to the switch 10. This function may be any of the usual functions of a sanitary appliance. The water temperature and the volumetric flow rate of the emerging water jet may be cited as examples of such functions.

A pressure applied to the material 22 surrounding the piezoelectric element 14 is transferred by said material to the piezoelectric element 14. In its surface, the sheathing 16 has an inelastic region, into which is cut a thread 24. By means of this thread, the sensor 12 is screwed into a complementary threaded opening 26 provided in the centre of a square retaining plate 28.

At its end which is opposite to the thread 24, the sheathing 16 of the sensor 12 has a full-perimeter round collar 30 by means of which the sensor 12, when it has been screwed into the retaining plate 28, bears on a damping ring 32 arranged between its collar 30 and the retaining plate 28.

The retaining plate 28 is carried by a hood-shaped elastic cover 34 provided over the sensor 12. The cover 34 comprises a square pressure plate 36, which extends a little beyond the dimensions of the retaining plate 28 on all sides.

Figure 2:
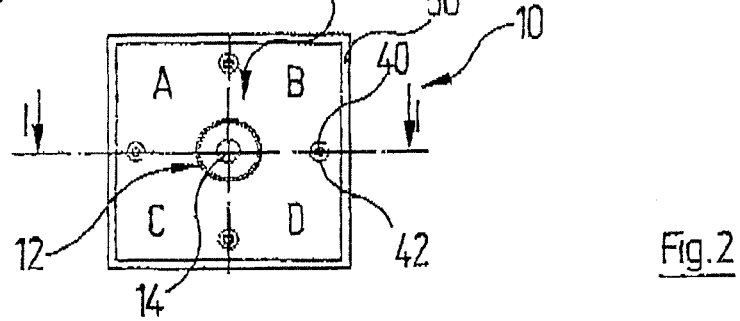
FIG. 2 shows, in smaller scale, a section of the exemplary embodiment according to FIG. 1, said section being along the section line II-II in FIG. 1.

For the purpose of fastening the retaining plate 28, four retaining pins 40 of circular cross-section are integrally formed on the inner surface 38 of the pressure plate 36, each of said retaining pins being arranged centrally in the outer edge regions of the pressure plate 36 of the cover 34, as shown especially by FIG. 2. An elastic retaining ring 42 having a full-perimeter outer groove 44 is pushed onto a tapered portion provided on the end region of the retaining pins 40 which carries the retaining plate 28. A collar 45 at the end of the retaining pin 40 prevents the elastic retaining ring 42 from slipping down from the retaining pin 40.

The retaining plate 28 has four openings 46, the arrangement of which corresponds to that of the retaining pins 40, and which are complementary to the outer grooves 44 of the retaining rings 42. By means of these openings 46, the retaining plate 28 is pushed onto the retaining pins 40 and is located in the outer grooves 44 of the retaining rings 42.

The cover 34 has the overall shape of a hood with a square top, which is constituted by the pressure plate 36. The cover 34, as part of a housing 48, is connected by the edge of its circumferential wall 35 to the base 50 of the housing 48, via an elastic sealing lip 49.

The dimensions of the individual components are matched to each other in such a way that, when the switch 10 is in the non-actuated state, a clearance remains between the sensor 12 and the base 50 of the housing 48.

In the centre of its inner surface 38, the pressure plate 36 of the cover 34 has an inelastic, domed elevation 52, which makes contact with the sensitive region 54 of the sensor 12. The sensitive region 54 of the sensor 12 is to be understood as being that region to which a certain pressure must be applied in order for the piezoelectric element 14 to generate a voltage.

As may be seen from FIGS. 1 and 2, the lateral extent of the switch 10, and therefore also of the cover 34, is distinctly greater overall than that of the sensor 12 and of the piezoelectric element 14 arranged therein.

The design of the switch 10 described above is such that substantially the entire visible outer surface of the pressure plate 36 of the cover 34 is available, as a pressure surface, to a user who wishes to use the sanitary appliance. It is not necessary for the pressure, for example finger pressure applied by the user, to be applied locally, or at least very close, to the sensitive region 54 of the sensor 12. Owing to the domed elevation 52 of the cover 34, even if a pressure upon the pressure plate 36 of the cover 34 is applied at a distance from the sensitive region 54 of the sensor 12, it is transferred to the sensitive region 54 of the sensor 12, and thus to the piezoelectric element 14.

For the purpose of illustration, the switch 10, or the pressure plate 36 of the cover 34, is to be divided into four square regions A, B, C and D of equal size, as represented in FIG. 2. It is to be pointed out that, in the case of the view of the switch 10 shown in FIG. 2, the pressure surface of the cover 34 is located behind the plane of the paper, on the side opposite to the user.

If the cover 34 is then pressed in, for example in the region A (cf. FIG. 2), the elastic pressure plate 36 yields inwardly at the point of pressure. By means of the retaining pins 40, the retaining plate 28 is concomitantly guided towards the base 50 of the housing 48 until the sensor 12 screwed into said retaining plate comes into contact with the base 50. If the pressure plate 36 is depressed further, the inelastic elevation 52 of the cover 34 moves further inwards, causing pressure to be applied to the sensitive region 54 of the sensor 12, which now cannot move further towards the base 50 of the housing

48. This pressure is sufficient to activate the piezoelectric element 14, resulting in the desired operation of the sanitary appliance.

In the case of an alternative design, the retaining plate 28 is fixed to the base 50 of the housing 48. This may be effected, for example, by means of pins having a coaxial threaded hole, said pins projecting inwards from the base 50 of the housing 48. The retaining plate 28 can be supported on these pins and fixed in place by means of screws which engage in a respective threaded hole of a pin.

The cover 34 and its inwardly facing, domed elevation 52 thus constitute coupling means by which a force applied at a distance from the sensitive region 54 of the sensor 12 is transferred to the sensitive region 54 of the sensor 12.

The switch 10 is realized in such a way that pressure is also intensified to a certain extent; a pressure applied to the pressure plate 36 over a large area is transferred, as an intensified pressure, to the small-area, sensitive region 54 of the sensor 12.

Figure 3:
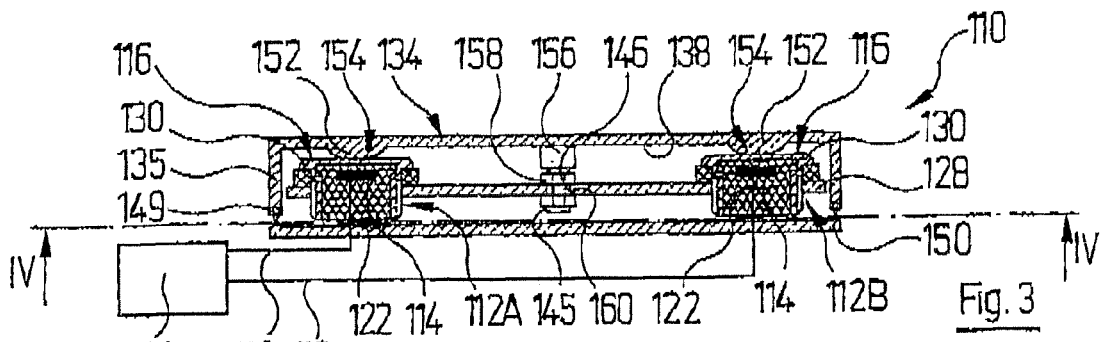
FIG. 3 shows a section of a second exemplary embodiment of a device for actuating a sanitary appliance, said section being along the section line III-III in FIG. 4.
Figure 4:
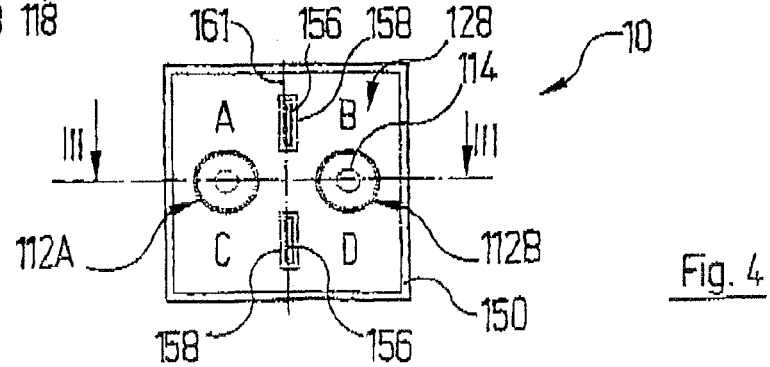
FIG. 4 shows, in smaller scale, a section of the exemplary embodiment according to FIG. 3, said section being along the section line IV-IV in FIG. 3.

FIGS. 3 and 4 show a second exemplary embodiment of a device for actuating a sanitary appliance, wherein components that correspond to the first exemplary embodiment are denoted by the same reference numerals incremented by 100.

As may be seen from FIGS. 3 and 4, the two-gang switch 110 represented therein comprises two sensors 112A and 112B, both of which are connected to the control system 120 via a respective line 118. The sensors 112 are arranged on the retaining plate 128, symmetrically relative to the central point, on a straight line extending through the central point of the retaining plate 128 and perpendicular to two opposing lateral edges of the retaining plate 128.

In contrast with the first exemplary embodiment, in the case of the exemplary embodiment of FIGS. 3 and 4 there are no retaining pins 40 of circular cross-section formed integrally on the inside 138 of the cover 134, there being instead two elongate retaining webs 156 which, in a tapered region, carry correspondingly elongate, elastic retaining rings 158 having a full-perimeter outer groove 160. The retaining plate 128 engages in this outer groove by means of openings 146 made to be complementary to said groove.

The retaining webs 156 extend along a mirror plane of symmetry 161 that is applicable to the arrangement of the sensors 112A and 112B and indicated as a broken line in FIG. 4. In this case, one retaining web 156 is located on the boundary line between the regions A and C already mentioned in relation to the first exemplary embodiment, and the other retaining web 156 is located, symmetrically relative to the plane of intersection and symmetry III-III of FIG. 4, on the boundary line between the corresponding regions B and D of the switch 110. This is shown in FIG. 4.

This switch 110 is suitable as a two-function pushbutton or as an on/off switch. This is because, if the pressure plate 136 of the cover 134 is depressed either in the region A or in the region C, only the sensor 112A that is on the left in FIGS. 3 and 4 is activated. The webs 156 act as rocker bearings, preventing force from being transferred to the sensitive region 154 of the sensor 112B that is on the right in FIGS. 3 and 4.

While the elevation 152 over the sensor 112A moves towards the latter, the elevation 152 over the sensor 112B is lifted away from the sensor 112B.

If, on the other hand, the pressure plate 136 of the cover 134 is depressed in one of the regions B or D, only the sensor 112B is activated as a result.

FIGS. 5 and 6 show a third exemplary embodiment of a device for actuating a sanitary appliance, wherein components that correspond to the exemplary embodiment of FIGS. 1 and 2 are denoted by the same reference numerals incremented by 200.

As may be seen from FIGS. 5 and 6, the four-gang switch 210 represented therein comprises four sensors 212A, 212B, 212C and 212D. These switches are each arranged centrally beneath a region A, B, C and D of the pressure plate 236 of the cover 234, on the retaining plate 228, each being beneath an elevation 252 integrally formed on the inside 238 of the pressure plate 236.

In this case, for the purpose of fastening the cover 234 to the retaining plate 228, only a single retaining pin 240 is integrally formed on the central point of the inside 238 of the pressure plate 236. In order to ensure secure fastening of the retaining plate 228 to the cover 234, the elastic retaining ring 242 is of a greater radial extent, and its outer groove 244 is deeper, than in the case of the retaining ring 40 of the first exemplary embodiment.

If the pressure plate 36 of the cover 34 is then depressed in one of the regions A, B, C or D, only the respective sensor 212A, 212B, 212C or 212D located beneath the corresponding region A, B, C or D of the pressure plate 236 is activated, whereupon the sanitary appliance is operated according to the function assigned to the activated sensor 212.

In the case of a modification of the exemplary embodiments described above, the cover 34, 134 and/or 234 is made of rigid material. In this case, the yielding of the elastic sealing lip 49, 149 and/or 249 ensures that the retaining plate 28, 128 and/or 228 can be moved towards the base 50, 150, 250 of the housing 48, 148 and/or 248, as described above, until the sensor 12, 112 and/or 212 makes contact with the base 50, 150 and/or 150.

It is to be emphasized that, in the case of a rigid cover 34, 134 and/or 234, the dimensions of the individual components of the switch 10, 110 and/or 210 are matched to each other in such a way that, when the switch 10, 110 and/or 210 is in the non-actuated state, the clearance remaining between the sensor 12, 112 and/or 212 and the base 50, 150 and/or 150 of the housing 48, 148 and/or 248 is less than the region occupied by the sealing lip 49, 149 and/or 249 between, on the one hand, the edge of the circumferential wall 35, 135 and/or 235 of the cover 34, 134 and/or 234 and, on the other hand, the base 50, 150 and/or 150 of the housing 48, 148 and/or 248.

The switches 10, 110 and 210 described above provide for a more convenient operation of sanitary appliances that use sensors to which a force must be applied, in a sensitive region, in order to actuate the sanitary appliance. In pressing the switch 10, 110 or 210, it is no longer necessary to ensure that the sensitive region 54, 154, 254 of the sensor 12, 112 and 212, respectively, is contacted as precisely as possible in that the cover 34, 134 and 234, respectively, is pressed in a precisely as possible above the sensor 12, 112, 212. Even "imprecise" pressing, at a certain distance from the sensitive region 54, 154, 254 of the sensor 12, 112, 212, results in the desired actuation of the sanitary appliance; depending on the design of the switch 10, 110, 210, this distance may be as much as a multiple of the extent of the sensitive region 54, 154, 254 of the sensor 12, 112, 212.

Moreover, an appropriate design of the associated covers 34, 134 and 234 of the switches 10, 110 and 210, respectively, renders possible adaptation to the design of a particular sanitary appliance, without a large resource requirement.

It is to be understood that additional embodiments of the invention described herein may be contemplated by one of ordinary skill in the art and that the scope of the present invention is not limited to the embodiments disclosed. While specific embodiments of the present invention have been illustrated and described, numerous modifications come to mind without significantly departing from the spirit of the invention, and the scope of protection is only limited by the scope of the accompanying claims.

The invention claimed is:

1. A device for actuating a sanitary appliance, the device comprising:
   a) a housing;
   b) at least one sensor arranged in the housing and provided with a pressure-sensitive element, wherein, for the purpose of actuating the sanitary appliance, a force that causes the element to be deformed can be applied to a sensitive region of the sensor; and
   c) a control system, which measures the deformation of the element and thereupon generates a signal by which a function of the sanitary appliance is controllable, wherein
   d) a coupling means is provided, which extend, in a direction perpendicular to the direction of actuation of the sensor, beyond the sensitive region of the sensor, and which enable a force applied at a distance from the sensitive region of the sensor to be transferred to the sensitive region of the sensor wherein the coupling means comprise a cover which projects, in a direction perpendicular to the direction of actuation of the sensor, beyond the sensitive region of the sensor and which cooperates with the sensitive region of the sensor by means of an elevation arranged on its inner surface that faces towards the sensor,
   and wherein the sensor is carried by a mount and a carrying structure that connects the mount to the cover is provided on the inner surface of the cover that faces towards the sensor.

2. The device according to claim 1, wherein the element is a piezoelectric or a piezoresistive element.

3. The device of claim 1, wherein the cover is at least partially elastic.

4. The device of claim 1, wherein the mount is fixed to the housing.

5. The device of claim 1, further comprising a single sensor, the carrying structure being constituted by retaining pins which surround the single sensor with a substantially uniform angular spacing.

6. The device of claim 5, wherein the carrying structure is constituted by four retaining pins.

7. The device of claim 1, further comprising two sensors, the carrying structure being constituted by at least one substantially rectilinear retaining web which extends along a mirror plane of symmetry between the two sensors that is applicable to the arrangement of the two sensors.

8. The device of claim 1, further comprising four sensors which are attached to the mount in such a manner that their positions describe the corner points of a rectangle, the carrying structure being constituted by a single retaining pin provided in the centre of the rectangle defined by the four sensors.

9. The device of claim 8, wherein the positions of the four sensors on the retaining plate describe the corner points of a square.

10. The device of claim 4, wherein the mount is fixed to the base of the housing.

11. The device of claim 2, wherein the cover is at least partially elastic.

12. The device of claim 2, wherein the mount is fixed to the housing.

13. The device of claim 2, further comprising a single sensor, the carrying structure being constituted by retaining pins which surround the single sensor with a substantially uniform angular spacing.

14. The device of claim 13, wherein the carrying structure is constituted by four retaining pins.

15. The device of claim 2, further comprising two sensors, the carrying structure being constituted by at least one substantially rectilinear retaining web which extends along a mirror plane of symmetry between the two sensors that is applicable to the arrangement of the two sensors.

16. The device of claim 15, further comprising four sensors which are attached to the mount in such a manner that their positions describe the corner points of a rectangle, the carrying structure being constituted by a single retaining pin provided in the centre of the rectangle defined by the four sensors.

* * * * *